(12) United States Patent
Gorman et al.

(10) Patent No.: US 10,511,141 B2
(45) Date of Patent: Dec. 17, 2019

(54) APPARATUS AND METHOD FOR PROVIDING OPTICAL RADIATION

(71) Applicant: SPI Lasers UK Limited, Hedge End (GB)

(72) Inventors: Philip Michael Gorman, Malvern (GB); Christophe Andre Codemard, Eastleigh (GB)

(73) Assignee: SPI Lasers UK Limited, Hedge End (GB)

( * ) Notice: Subject to any disclaimer, the term of this patent is extended or adjusted under 35 U.S.C. 154(b) by 0 days.

(21) Appl. No.: 15/775,536

(22) PCT Filed: Nov. 30, 2016

(86) PCT No.: PCT/GB2016/000211
§ 371 (c)(1),
(2) Date: May 11, 2018

(87) PCT Pub. No.: WO2017/093704
PCT Pub. Date: Jun. 8, 2017

(65) Prior Publication Data
US 2018/0351326 A1 Dec. 6, 2018

(30) Foreign Application Priority Data
Dec. 1, 2015 (GB) .................................. 1521214.5

(51) Int. Cl.
*H01S 5/042* (2006.01)
*H01S 3/23* (2006.01)
(Continued)

(52) U.S. Cl.
CPC .......... *H01S 5/0428* (2013.01); *H01S 3/2308* (2013.01); *H01S 5/0057* (2013.01);
(Continued)

(58) Field of Classification Search
CPC .... H10S 5/0428; H10S 5/0057; H10S 5/0656; H10S 5/14; H10S 5/4006; H10S 5/0427;
(Continued)

(56) References Cited

U.S. PATENT DOCUMENTS

| 4,995,044 A | 2/1991 | Blazo |
| 5,062,113 A | 10/1991 | Takahashi |
| 2014/0185643 A1 | 7/2014 | McComb et al. |

FOREIGN PATENT DOCUMENTS

| JP | H08 222787 A | 8/1996 |
| JP | 2011 023474 A | 2/2011 |

*Primary Examiner* — Armando Rodriguez
(74) *Attorney, Agent, or Firm* — Iandiorio Teska & Coleman, LLP

(57) ABSTRACT

Apparatus for providing optical radiation (1), which apparatus comprises a laser diode (2), a pulse generator (9), and a modulator (5), wherein: the pulse generator (9) is configured to emit picosecond pulses; the modulator (5) is configured to emit nanosecond pulses; the laser diode (2) has a first terminal (6) and a second terminal (7); the pulse generator (9) is connected to the first terminal (6); and the modulator (5) is configured to bias the laser diode (2) below a lasing threshold (8) of the laser diode (2), and the apparatus being characterized in that: the modulator (5) is connected to the second terminal (7); the pulse generator (9) comprises a semiconductor junction (32) connected to a differentiator (4); the semiconductor junction (32) is such that electric current flowing through the semiconductor junction (32) can be turned off more quickly than it can be turned on; and the differentiator (4) is such that a step change that occurs when the electric current flowing through the semiconductor junction (32) is turned off is converted to an electrical pulse, thereby gain switching the laser diode (2) such that it emits an optical pulse (10) having an optical pulse width (11) less than 10 ns.

20 Claims, 5 Drawing Sheets

(51) Int. Cl.
　　　*H01S 5/00*　　　　　(2006.01)
　　　*H01S 5/065*　　　　(2006.01)
　　　*H01S 5/14*　　　　　(2006.01)
　　　*H01S 5/40*　　　　　(2006.01)

(52) U.S. Cl.
　　　CPC .............. *H01S 5/0656* (2013.01); *H01S 5/14* (2013.01); *H01S 5/4006* (2013.01); *H01S 2301/03* (2013.01)

(58) Field of Classification Search
　　　CPC ............. H10S 5/06216; H10S 5/06226; H01S 2301/03; H01S 3/2308
　　　See application file for complete search history.

APPARATUS AND METHOD FOR PROVIDING OPTICAL RADIATION

FIELD OF INVENTION

This invention relates to apparatus and a method for providing optical radiation. The invention has particular application for pulsed lasers including semiconductor diode lasers and fibre lasers, and for marking, cutting and welding with such lasers.

BACKGROUND TO THE INVENTION

Gain switched laser diodes have important applications for marking, cutting, scribing, and other industrial processing of materials that require pulse widths in the picosecond to low nanosecond range. The pulse is generated by modulating the gain of the laser via the pump power. If a high pump power is suddenly applied to the laser, laser emission commences after a short delay. The pulse commences with weak fluorescence light, which is then amplified in a number of resonator round trips. Energy stored in the gain medium is thus extracted in the form of a short pulse. The laser diode can be operated with short electric current pulses, or with a continuously modulated electrical signal. Typical pulse lengths that are achievable range from a few nanoseconds down to a few tens of picoseconds. The pulse repetition rate is controlled electronically, and can be varied over a wide range. It is usual for the laser to be biased below the laser threshold prior to the pump power being increased. A seed laser pulse can be amplified by optical amplifiers to provide pulses having energies in the microJoule or milliJoule range.

USA Patent Application No. 2014/0185643 describes gain switched laser diodes that are used to provide seed pulses for optical pulse generation. Amplified spontaneous emission (ASE) is reduced by applying a prebias to the laser diodes at an amplitude less than that associated with a laser diode threshold. An electrical seed pulse having an amplitude larger than that associated with the laser threshold is applied within about 10-100 ns of the prebias pulse. The resulting laser diode pulse can be amplified in a pumped, rare earth doped optical fiber, with reduced ASE. The patent application describes how the prebias is combined with the seed pulse in a microwave power splitter that includes resistors that are selected to provide suitable split ratios or impedance matching. Unfortunately such impedance matching causes attenuation of the signals that are applied to the laser diode, which in turn affects the pulse energy of the laser emission. This deficiency can be cured using ultra-wide-bandwidth electronic amplifiers to amplify the electrical pulse signal. However, ultra-wide-bandwidth electronic amplifiers are expensive.

There is a need for apparatus and a method for providing optical radiation that avoids or reduces the aforementioned problems.

THE INVENTION

According to a non-limiting embodiment of the present invention there is provided apparatus for providing optical radiation, which apparatus comprises a laser diode, a pulse generator, and a modulator, wherein:
  the pulse generator is configured to emit picosecond pulses;
  the modulator is configured to emit nanosecond pulses;
  the laser diode has a first terminal and a second terminal;
  the pulse generator is connected to the first terminal; and
  the modulator is configured to bias the laser diode below a lasing threshold of the laser diode,
and the apparatus being characterized in that:
  the modulator is connected to the second terminal;
  the pulse generator comprises a semiconductor junction connected to a differentiator;
  the semiconductor junction is such that electric current flowing through the semiconductor junction can be turned off more quickly than it can be turned on; and
  the differentiator is such that a step change that occurs when the electric current flowing through the semiconductor junction is turned off is converted to an electrical pulse, thereby gain switching the laser diode such that it emits an optical pulse having an optical pulse width less than 1 ns.

Surprisingly, the inventors have discovered that it is possible to bias the laser diode by applying a pulsed signal from the modulator to the second terminal of the laser diode, and then to gain switch the laser diode by applying a shorter pulsed signal from the pulse generator to the first terminal of the laser diode. Gain switching the laser diode using pulses applied to both sides of the laser diode has important advantages over the prior art, including:
  Avoiding the use of more expensive ultra-wide-bandwidth electronic amplifiers;
  Reduction of electronic power requirements, and associated cooling requirements, compared to other solutions;
  Avoidance of attenuation of the drive signals in the impedance matched combiner of prior art systems;
  Faster turn-on times for the equivalent voltage drives as a result of the reduced attenuation;
  Faster turn off times for the equivalent voltage drives as a result of the reduced attenuation; and
  A reduction in spontaneous emission around the pulses compared to prior art pre-biased gain switched systems owing to the faster turn on and turn off times.

Preferably, the semiconductor junction forms part of a step recovery device that uses step recovery to turn off the electric current. Other semiconductor devices can also be used, such as PIN diodes, varactor diodes and field effect transistors. However the electric current flowing through them cannot be turned off as quickly as it can with step recovery devices.

The semiconductor junction and the differentiator may be configured such that the optical pulse width is less than 250 µs. The semiconductor junction and the differentiator may be configured such that the optical pulse width is less than 100 µs.

The pulse generator may comprise a bipolar transistor having the semiconductor junction. The bipolar transistor may be configured as a common base amplifier. The bipolar transistor may form part of a cascode amplifier.

The differentiator may comprise an electrical waveguide defined by a first length and a first characteristic impedance. The semiconductor junction may be connected to a first end of the electrical waveguide. A second end of the electrical waveguide may be defined by an impedance that is less than the first characteristic impedance, thereby causing a step voltage signal defined by a polarity propagating along from the first end of the electrical waveguide to the second end of the electrical waveguide to be reflected back to the first end of the electrical waveguide with the opposite polarity. The first length may thus be adjusted in order to adjust the optical pulse width.

The second terminal may be connected to the modulator with an electrical waveguide defined by a second length and a second characteristic impedance. The modulator may be defined by an output impedance. The output impedance may be higher than the second characteristic impedance. Electrical pulse signals defined by a polarity propagating down the electrical waveguide from the second terminal to the modulator would then be reflected with the same polarity. Advantageously, reflecting a pulse signal back with the same polarity assists in turning off the laser diode. The second length may thus be adjusted in order to adjust the optical pulse width.

The apparatus may comprise at least one optical reflector configured to receive the optical radiation emitted by the laser diode, which optical reflector is positioned at a third distance from the laser diode. The third distance may be selected such that optical pulses reflected by the optical reflector overlap temporally with successive ones of the optical pulses.

The semiconductor laser may be such that the optical pulse is chirped. The apparatus may include a dispersive element configured to change the pulse width of the optical pulse. The dispersive element may be selected to change the pulse width to less than fifty picoseconds. The dispersive element may be selected to change the pulse width to less than ten picoseconds.

The apparatus may include at least one optical amplifier configured to amplify optical pulses emitted by the laser diode.

The apparatus may comprise a seed laser and a coupler. The coupler may be arranged to couple optical radiation emitted by the seed laser with the optical radiation emitted by the semiconductor laser for subsequent amplification by the optical amplifier. The apparatus may be configured such that optical pulses emitted by the semiconductor laser are superimposed on optical pulses emitted by the seed laser. The coupler may be a polarisation beam splitter.

The apparatus may include a scan head for scanning the optical radiation onto a surface of a component.

The present invention also provides apparatus for providing optical radiation, which apparatus comprises a pulse generator for emitting a first electrical pulse defined by a first pulse width and a first polarity, and a modulator for emitting a second electrical pulse defined by a second pulse width and a second polarity, the pulse generator is connected to a first terminal of a laser diode, and the modulator is connected to the second terminal of the laser diode, wherein the first pulse width is shorter than the second pulse width, and the first polarity is opposite to the second polarity.

The present invention also provides a method for gain switching a laser diode, which method comprises selecting a pulse generator and a modulator, connecting the pulse generator and the modulator to opposite terminals of a laser diode, causing the pulse generator to emit a first electrical pulse, causing the modulator to emit a second electrical pulse, wherein the first electrical pulse has a pulse width that is shorter than a pulse width of the second electrical pulse, and the first electrical pulse has the opposite polarity of the second electrical pulse.

The present invention also provides a method for providing optical radiation, comprising:
  providing a laser diode that has a first terminal and a second terminal;
  selecting a modulator that emits nanosecond pulses and which can be configured to bias the laser diode below a lasing threshold of the laser diode; and
  the method being characterized by the following steps:
  selecting a pulse generator that comprises a semiconductor junction connected to a differentiator; wherein the semiconductor junction is such that electric current flowing through the semiconductor junction can be turned off more quickly than it can be turned on;
  the pulse generator is connected to the first terminal;
  the modulator is connected to the second terminal;
  using the modulator to bias the laser diode below a lasing threshold of the laser diode;
  causing the semiconductor junction to emit a step change in output voltage as the electric current is turned off;
  using the differentiator to differentiate the step change in output voltage to create an electrical pulse; and
  using the electrical pulse to gain switch the laser diode such that it emits an optical pulse having an optical pulse width less than 1 ns.

In the method of the invention, the semiconductor junction may form part of a step recovery device that uses step recovery to turn off the electric current.

In the method of the invention, the semiconductor junction may be selected and the differentiator may be configured such that the optical pulse width is less than 250 µs. The semiconductor junction may be selected and the differentiator may be configured such that the optical pulse width is less than 100 µs.

In the method of the invention, the pulse generator may comprise a bipolar transistor having the semiconductor junction.

In the method of the invention, the bipolar transistor may be configured as a common base amplifier.

In the method of the invention, the bipolar transistor may form part of a cascode amplifier.

The method of the invention may be one in which the differentiator comprises an electrical waveguide defined by a first length and a first characteristic impedance. The semiconductor junction may be connected to a first end of the electrical waveguide. A second end of the electrical waveguide may be defined by an impedance that is less than the first characteristic impedance, thereby causing a step voltage signal defined by a polarity propagating along from the first end of the electrical waveguide to the second end of the electrical waveguide to be reflected back to the first end of the electrical waveguide with the opposite polarity. The method of the invention may be one in which the first length is selected to provide a pulse length of a desired length.

The method of the invention may be one in which the second terminal is connected to the modulator with an electrical waveguide defined by a second length and a second characteristic impedance. The modulator may be defined by an output impedance, and the output impedance may be higher than the second characteristic impedance, thereby causing electrical pulse signals defined by a polarity propagating down the electrical waveguide from the second terminal to the modulator to be reflected with the same polarity. The method of the invention may be one in which the second length is selected to provide a pulse length of the desired length.

In the method of the invention, at least one optical reflector may be configured to receive optical pulses emitted by the laser diode. The optical reflector may be positioned at a third distance from the laser diode. The third distance may be selected such that optical pulses reflected by the optical reflector overlap temporally with successive ones of the optical pulses.

In the method of the invention, the optical pulse emitted by the optical amplifier may be chirped. The method can comprise the step of providing a dispersive element to change the pulse width of the optical pulse. The dispersive element may be selected to change the pulse width to less than fifty picoseconds. The dispersive element may be selected to change the pulse width to less than ten picoseconds.

In the method of the invention, at least one optical amplifier may be configured to amplify optical pulses emitted by the laser diode.

In the method of the invention, a seed laser and a coupler may be provided, wherein the coupler is arranged to couple optical radiation emitted by the seed laser with the optical radiation emitted by the semiconductor laser for subsequent amplification by the optical amplifier. The apparatus may be configured such that optical pulses emitted by the semiconductor laser are superimposed on optical pulses emitted by the seed laser. The coupler may be a polarisation beam splitter.

The method may include providing a scan head and scanning the optical radiation onto a surface of a component.

BRIEF DESCRIPTION OF THE DRAWINGS

Embodiments of the invention will now be described solely by way of example and with reference to the accompanying drawings in which.

DETAILED DESCRIPTION OF PREFERRED EMBODIMENTS OF THE INVENTION

Figure 1:
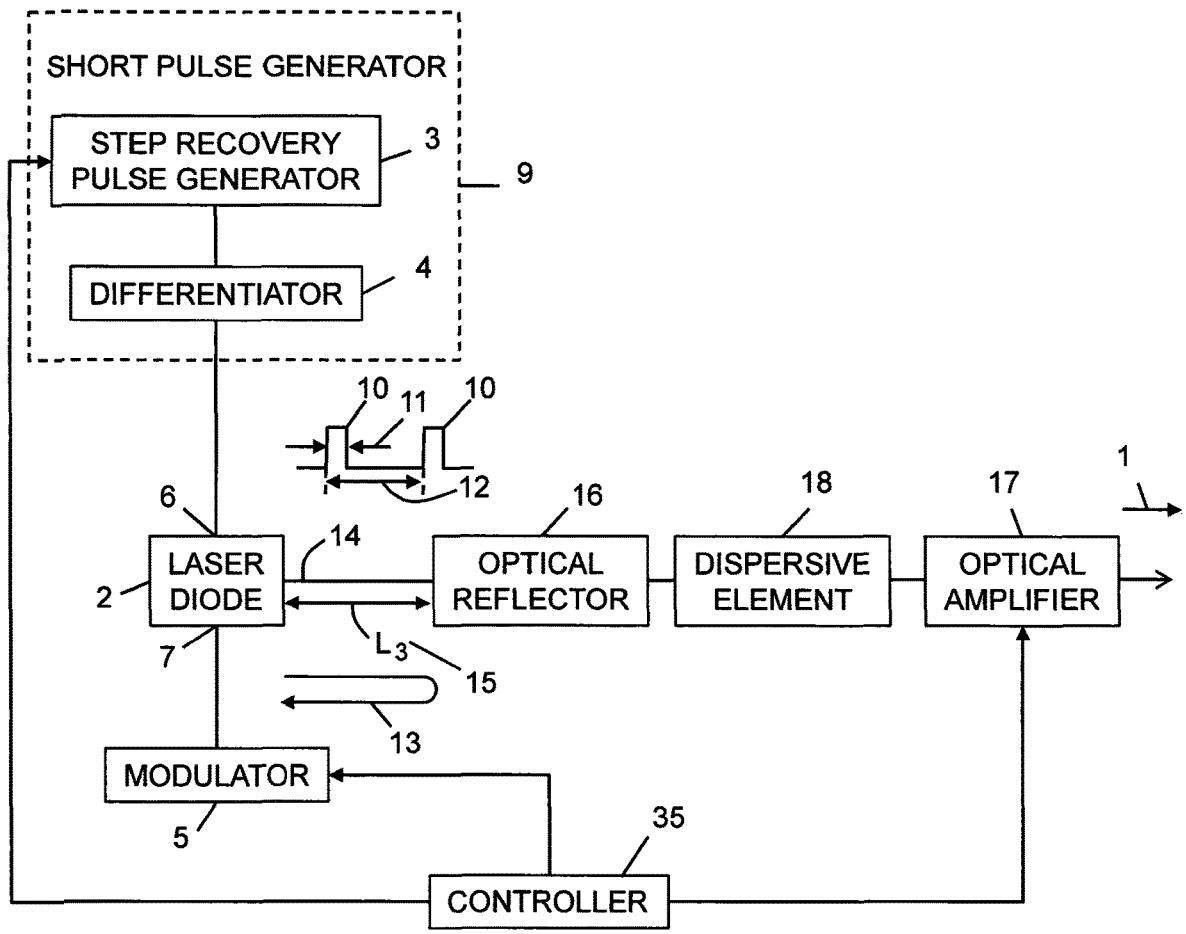
FIG. 1 shows apparatus for providing optical radiation according to the present invention.

FIG. 1 shows apparatus for providing optical radiation 1, which apparatus comprises a laser diode 2, a pulse generator 9, and a modulator 5, wherein:

the laser diode 2 has a first terminal 6 and a second terminal 7;
the pulse generator 9 is connected to the first terminal 6;
the modulator 5 is connected to the second terminal 7;
the modulator 5 is selected to bias the laser diode 2 below a lasing threshold 8, shown in FIG. 2, of the laser diode 2.

The pulse generator 9 is shown as comprising a step recovery pulse generator 3 and a differentiator 4.

The laser diode 2 is shown emitting optical pulses 10 that have a pulse width 11, and a period 12. The pulse width 11 is defined by its full width half maximum value. The apparatus can emit a pulse chain with a pulse repetition frequency equal to the inverse of the period 12. The apparatus of FIG. 1 is particularly provides optical pulses 10 having pulse widths 11 in the picosecond to nanosecond range. The pulse width 11 may be less than 10 ns, less than 1 ns, preferably less than 250 µs, and more preferably less than 100 µs.

The laser diode 2 may comprise indium gallium arsenide. Such laser diodes can have turn on voltages exceeding 1.8V. The laser diode 2 may have a turn-on voltage that is higher than the turn-on voltage of a step-recovery diode or transistor. The laser diode 2 may be a Fabry-Perot semiconductor laser diode, such as the LC96A laser diode manufactured by II-VI Laser Enterprise of Zurich Switzerland. Alternatively, the laser diode 2 may be a distributed feedback (DFB) semiconductor laser diode, such as the CPE05413 (LC-DFB) of II-VI Laser Enterprise of Zurich Switzerland. The laser diode 2 may also be vertical cavity surface emitting laser VCSEL or other types of semiconductor laser diode.

Figure 2:
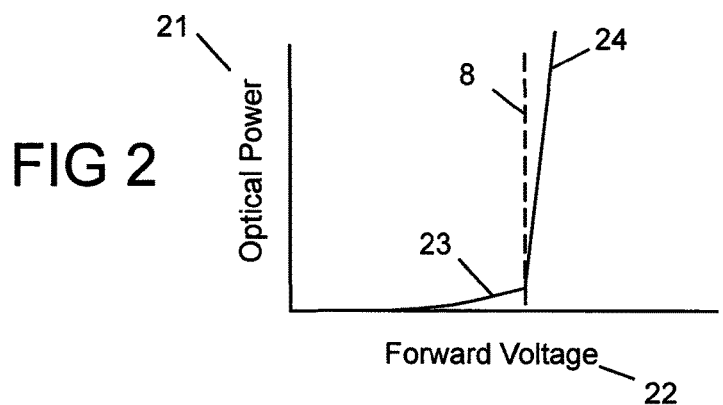
FIG. 2 shows a laser diode characteristic.

FIG. 2 shows how optical power 21 emitted by the laser diode 2 varies with the forward voltage 22 applied across the diode 2. Below the laser threshold 8, the optical power 21 increases with forward voltage 22 applied across the laser diode 2, and the optical power 21 increases as shown by the curve 23. The laser diode 2 behaves like a light emitting diode, emitting incoherent light. Above the laser threshold 8, lasing action is initiated, and the laser diode 2 emits laser light that is coherent, and the optical power 21 increases as shown by the curve 24. The rate of change of optical power 21 with the applied forward voltage 22 is significantly larger above the laser threshold 8 than below the laser threshold 8, that is, the curve 24 is much steeper than the curve 23.

Figure 3:
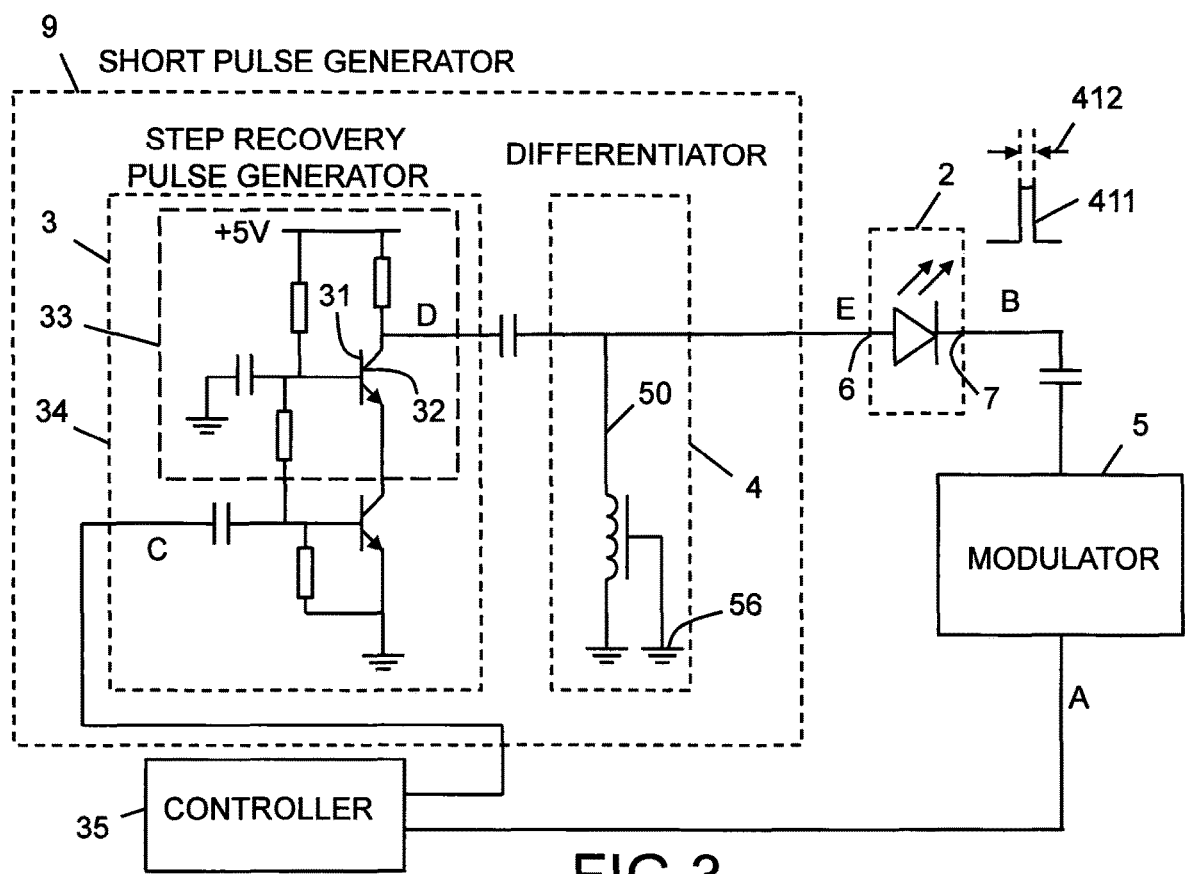
FIG. 3 shows a step recovery pulse generator that comprises a cascode amplifier.

FIG. 3 shows an example implementation of the step recovery pulse generator 3 of FIG. 1. The step recovery pulse generator 3 comprises a bipolar transistor 31 having a semiconductor junction 32 that is able to come out of saturation using step recovery more quickly than it enters into saturation. The semiconductor junction 32 is the collector base junction of an npn transistor. When the bipolar transistor 31 is driven into saturation, the base-collector and base-emitter junctions become forward biased and minority charge carriers are injected and stored across the base-collector junction. If the saturated transistor is suddenly reverse biased, the base-collector pn-junction will appear as a low impedance until the stored charge is depleted. Once depleted, the impedance will suddenly increase to its normal high value and the flow of current through the base-collector junction will suddenly turn to zero. The bipolar transistor 31 forms part of a common base amplifier 33, which in turn forms part of a cascode amplifier 34. Cascode amplifiers have excellent characteristics for use in high frequency amplifiers as they provide the performance of a common-emitter stage with a much smaller Miller effect and much larger output resistance. Other transistor circuits, such as common emitter, common source, or differential amplifiers, including long tailed pairs, can also be used. Other step recovery components, such as step recovery diodes, can be used. However step recovery diodes are relatively expensive and do not have the inherent signal gain that is provided by a transistor.

Figure 4:
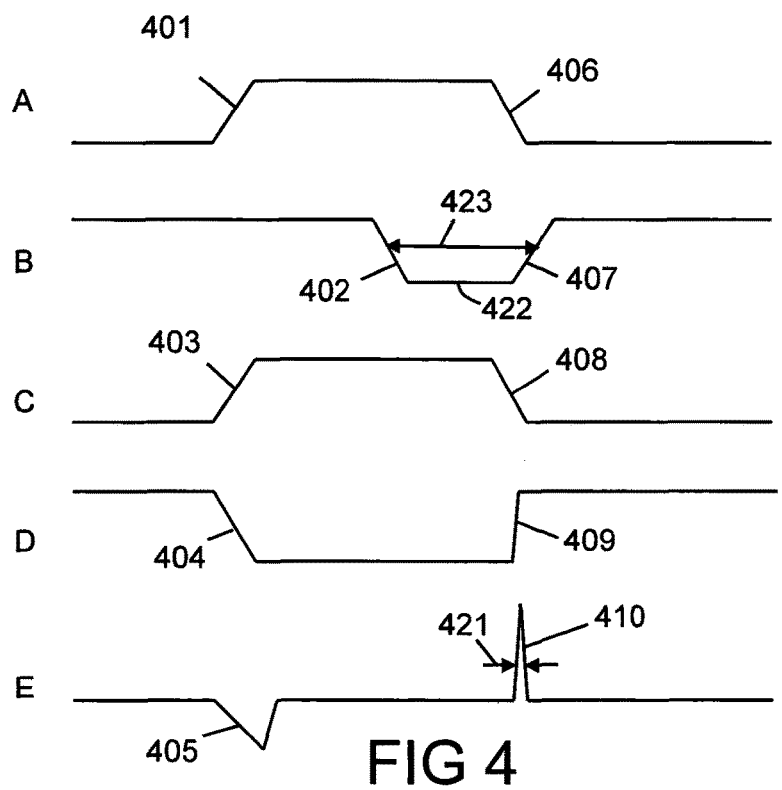
FIG. 4 shows some timing diagrams corresponding to the circuit shown in FIG. 3.

The apparatus of FIG. 3 includes a controller 35 that controls the step recovery pulse generator 3 and the modulator 5. Test points A, B, C, D and E are identified, and the corresponding voltage signals are shown in FIG. 4. A positive going signal 401 is applied to the modulator 5. The modulator 5 then emits a negative going signal 402, and the modulator 5 biases the laser diode 2 below its lasing threshold 8. The controller 35 emits a positive going signal 403 which is applied to the cascode amplifier 34. The collector base junction 32 of the transistor 31 is driven into saturation resulting in a negative going pulse 404 and minority carriers (not shown) to be stored in the collector base junction 32. The negative going pulse 404 causes a negative going signal 405 to be output from the differentiator 4.

The falling edge 406 of the signal applied to the modulator 5 causes a positive going signal 407 to be output from the modulator 5. The laser diode 2 is then no longer biased. The negative going signal 408 applied to the cascode amplifier 34 causes the collector base junction 32 of the transistor 31 to come out of saturation, suddenly, as the stored minority carriers are depleted. Electric current flowing through the collector base junction 32 ceases abruptly, which results in a step recovery response characterised by a rapid positive going step 409. The positive going step 409 is differentiated by the differentiator 4 resulting in a narrow positive-going electrical pulse 410 being applied to the laser diode 2. The electrical pulse 410 gain switches the laser diode 2, which emits a pulse of laser radiation 411 shown with reference to FIG. 3. It should be noted that the cascode amplifier of FIG. 3 is simple, can be constructed with low cost components that are commonly available, and is much cheaper than the alternative ultra-wide-band amplifier approaches. It is also smaller, and consumes at least two orders of magnitude less electrical power.

Referring to FIGS. 3 and 4, the pulse generator 9 and the modulator 5 are connected to opposite terminals 6, 7 of the laser diode 2. The electrical pulse 410 emitted by the pulse generator 9 is a positive going pulse, and the electrical pulse 422 emitted by the modulator 5 is a negative going pulse; the electrical pulses 410, 422 have opposite polarities. The electrical pulse 410 has a pulse width 421 that is smaller than a pulse width 423 of the electrical pulse 422.

The pulse width 421 may be selected to provide a single gain-switched optical pulse 10, or a plurality of gain-switched optical pulses 10. It is generally preferred that the pulse width 421 is sufficiently short such that the laser diode 2 emits a single gain-switched optical pulse 10. If the pulse width 421 is longer, then the laser diode 2 can emit multiple gain switched optical pulses 10, shown with reference to FIG. 1, for each electrical pulse 410 emitted by the pulse generator 9. The pulse width 421 may be less than 10 ns, less than 1 ns, preferably less than 250 µs, and more preferably less than 100 µs.

The modulator 5 may be such that it provides a constant bias for the laser diode 2. However it is generally preferred that the laser diode 2 is turned off between the optical pulses 10 in order to reduce spontaneous emission from the laser diode 2. The pulse width 423 is preferably selected to minimize the spontaneous emission from the laser diode 2.

The circuit shown in FIG. 3 is capable of emitting pulses of laser radiation 411 having pulse widths 412 less than 10 ns, preferably less than 1 ns, and more preferably less than 100 µs. Such circuit designs require good radio-frequency layouts.

Figure 5:
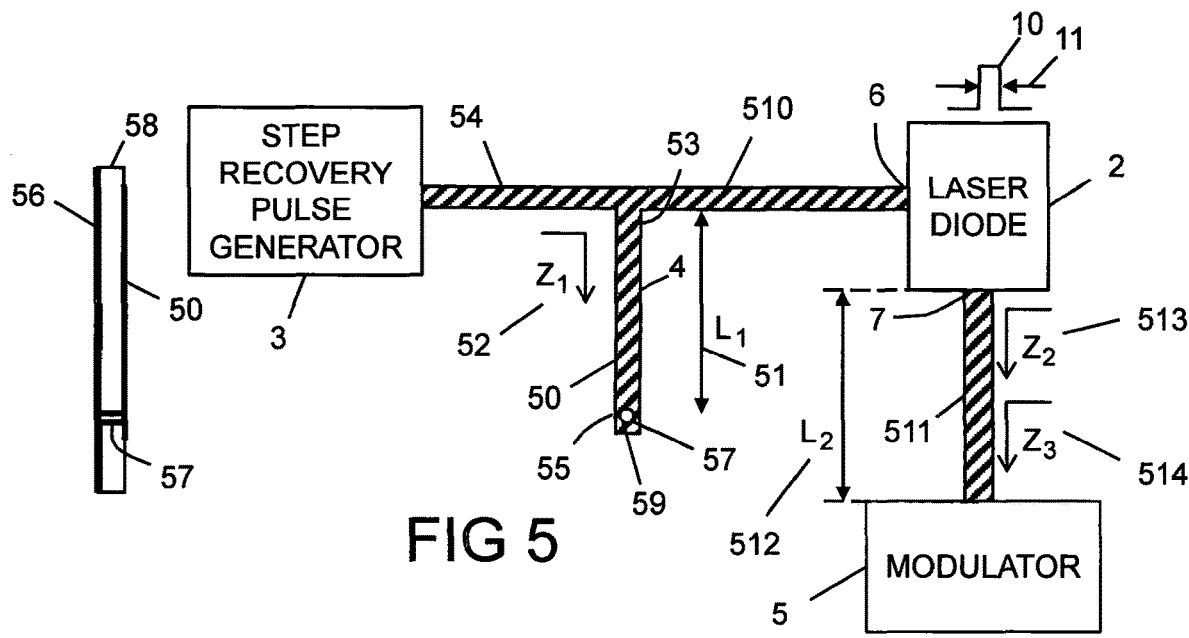
FIG. 5 shows an implementation of a differentiator.

The differentiator 4 may comprise an electrical waveguide 50 defined by a first length $L_1$ 51 and a first characteristic impedance $Z_1$ 52 as shown with reference to FIG. 5. The electrical waveguide 50 is shown as tracks on a printed circuit board 58 that has a ground plane 56. The printed circuit board 58 is shown in both plan view, with the waveguide 50 detailed, and in cross-section. The step recovery pulse generator 3 may be connected to a first end 53 of the electrical waveguide 50, for example via the electrical waveguide 54. A second end 55 of the electrical waveguide 50 may be connected to the ground plane 56 using a connection 57 that has an impedance 59 that is less than the first characteristic impedance $Z_1$ 52. The impedance 59 is preferably a short circuit having a zero ohm impedance, which may be achieved through a via hole connection between layers in a printed circuit board, or a connection to a ground plane on the same layer in the printed circuit board. Alternatively, the connection 57 may be a selectable connection such as a wire link, a switch, a diode, or a transistor. Selectable connections are advantageous for printed circuits having more than one of the waveguide 50, each having a different first length $L_1$ 51. The printed circuit board can then be designed to be compatible with different types of the laser diode 2 by choosing the waveguide 50 with the best choice of the first length $L_1$ 51, providing a low impedance or short circuit 59 at the end of the selected waveguide 50, and impedance matching the other of the waveguides 50 by selecting the impedance 59 to be equal to the characteristic impedance $Z_1$ 52 of the waveguide 50 so at to avoid unwanted electrical reflections. Alternatively or additionally, in some cases, the impedance 59 in one or more of the additional waveguides 50 can be selected to have a higher impedance than the characteristic impedance $Z_1$ 52 of the waveguide 50 in order to cause electrical reflections and thus create a pulse shape optimized for driving the laser diode 2.

Figure 6:
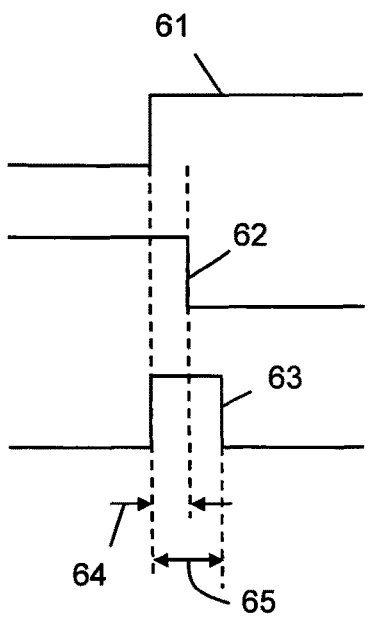
FIG. 6 shows a waveform reflected back down an electronic waveguide with reverse polarity.

With reference to FIG. 6, a positive-going step voltage signal 61 that propagates from the first end 53 of the electrical waveguide 50 to the second end 55 in a time 64 will be reflected back to the first end 53 as a negative-going step voltage signal 62. The positive going signal 61 and the negative going signal 62 have opposite polarities. The result is a pulse 63 at the first end 53, having a pulse width 65 that corresponds to the round trip delay (approximately two times the time 64) of the electrical waveguide 50. The pulse 63 propagates along the waveguide 510 to the laser diode 2. By tailoring the first length $L_1$ 51 of the waveguide 50, it is possible to set the pulse width 65 to a predetermined value. Pulse widths 65 in the range 10 µs to 500 µs are readily achievable. Longer pulse widths can also be obtained, for example by using longer track lengths, coaxial cables, or other forms of electrical waveguides. Other implementations of the differentiator 4 are also possible.

Figure 7:
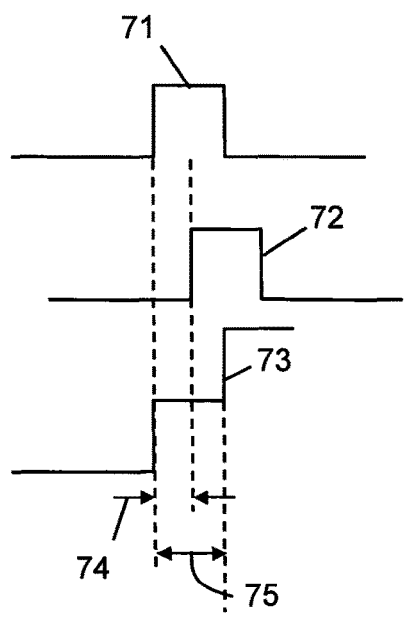
FIG. 7 shows a waveform reflected back down an electronic waveguide with the same polarity.

Returning to FIG. 5, the electrical waveguide 510 is connected to the first terminal 6 of the laser diode 2. The second terminal 7 of the laser diode 2 is connected to the modulator 5 with an electrical waveguide 511. In this example, the first terminal 6 is connected to the anode of the laser diode 2, and the second terminal 7 is connected to the cathode of the laser diode 2. For clarity, capacitors shown in FIG. 3 are not shown in FIG. 5. The electrical waveguide 511 is defined by a second length $L_2$ 512 and a second characteristic impedance $Z_2$ 513. The modulator 5 has an output impedance $Z_3$ 514. A typical value for the first and the second characteristic impedances 52, 513 is 50Ω. If the modulator 5 is implemented using a high speed transistor transistor logic (TTL) gate, the output impedance $Z_3$ 514 when the modulator is outputting logic zero is typically around 2 kΩ, which is higher than the characteristic impedance $Z_2$ 513. Thus a pulse 71, shown in FIG. 7, travelling down the waveguide 511 from the laser diode 2 to the modulator 5 in a time 74 will be reflected back up the waveguide 511 as a pulse 72 with the same polarity as the pulse 71. The pulse 72 arriving at the laser diode 2 after a round trip delay 75 will re-inforce the pulse 71 as shown by the signal 73. The addition of the pulses will assist in turning off the laser diode 2. The second length $L_2$ 512 may thus be selected to tailor the optical pulse width 11 of the optical pulse 10 emitted by the laser diode 2.

Referring again to FIG. 1, the laser diode 2 is connected to at least one optical reflector 16 using optical fibre 14. The optical reflector 16 is positioned at a third distance $L_3$ 15 from the laser diode. The optical reflector 16 reflects the optical pulses 10 emitted by the laser diode 2. The length $L_3$ 15 can be selected such that the optical pulses 10 emitted by the laser diode 2 are reflected back to the laser diode 2 such that they overlap temporally with subsequent optical pulses 10 within the laser diode 2, thus seeding the formation of the subsequent optical pulses 10. The round trip time 13 of the optical pulses 10 from the laser diode 2 to the reflector 16 and back to the laser diode 2 is preferably either the period 12 of the optical pulses 10, or an integer multiple of the period 12. By this means, optical feedback is provided for the laser diode 2 in order to stabilize the wavelength of the optical pulses 10, or to shorten the pulse widths 11 of the optical pulses 10. The matching of the round trip time 13 to the period 12 or multiples thereof is particularly advantageous when the laser diode 2 is a Fabry-Perot semiconductor laser diode, but can be advantageous when using other types of laser diodes, such as distributed feedback (DFB) laser diodes, as well. The optical reflector 16 may be a fibre Bragg grating. The reflectivity of the optical reflector 16 may be in the range 0.1% to 25%, and preferably in the range 4% to 20%.

It can be advantageous to have an additional optical reflector 16 located at a different third distance $L_3$ 15 from the laser diode 2, which different third distance $L_3$ is selected to provide a pulse train with a different period 12 and hence enable a different pulse repetition frequency. The additional optical reflector 16 may be selected such that the pulse width 11 is also different from that provided by the first optical reflector 16 described above, by for example adjusting at least one of the reflectivity, the central wavelength, and the bandwidth of the additional optical reflector 16.

It can also be advantageous to have an additional optical reflector 16 positioned to broaden the bandwidth of the optical radiation 1 emitted by the apparatus in order to avoid stimulated Brillouin scattering. This is particularly important for pulse widths 11 greater than around 4 ns. The resulting apparatus would then be able to emit picosecond pulses, as well as longer nanosecond, microsecond, millisecond, or longer pulses without the problems caused by stimulated Brillouin scattering. Using such reflectors to reduce the effects of stimulate Brillouin scattering is described in U.S. Pat. No. 7,936,796, which patent is hereby incorporated by reference herein.

Also shown in FIG. 1 is an optical amplifier 17 configured to amplify the optical pulses 10 emitted by the laser diode 2. The apparatus may include more than one optical amplifier 17, the first acting as a preamplifier, and the last acting as a power amplifier. The optical amplifiers 17 may be optical fibre amplifiers. Alternatively or additionally, the power amplifier may be a solid state amplifier, such as a yttrium aluminum garnet amplifier. The latter can be used to amplify optical pulses to higher peak powers than are obtainable with optical fibre amplifiers. The controller 35 can be used to control pumps (not shown) in the optical amplifier 17. Turning off the pumps can be advantageous to reduce unwanted amplified spontaneous emission from the optical amplifier 17 when the optical pulses 10 are not present.

The apparatus of FIG. 1 is shown as having an optional dispersive element 18 which can be used to either shorten the pulse widths 11 of the optical pulses, or to lengthen the pulse widths 11. This method of changing the pulse width 11 relies on the optical pulses 10 emitted by the laser diode 2 being chirped. Thus by selecting the appropriate dispersive element 18, the pulse width 11 can be either shortened or lengthened. Suitable dispersive elements 18 include a length of single mode optical fibre, a length of photonic bandgap fibre, a chirped Bragg grating, or a bulk grating. The dispersive element 18 can be selected to change the pulse width 11 to less than fifty picoseconds. The dispersive element 18 can be selected to change the pulse width 11 to less than ten picoseconds. Pulse widths 11 can be shortened from a few hundred picoseconds to ten to fifty picoseconds by this method. Shorter pulse widths 11 can also be obtained.

Figure 8:
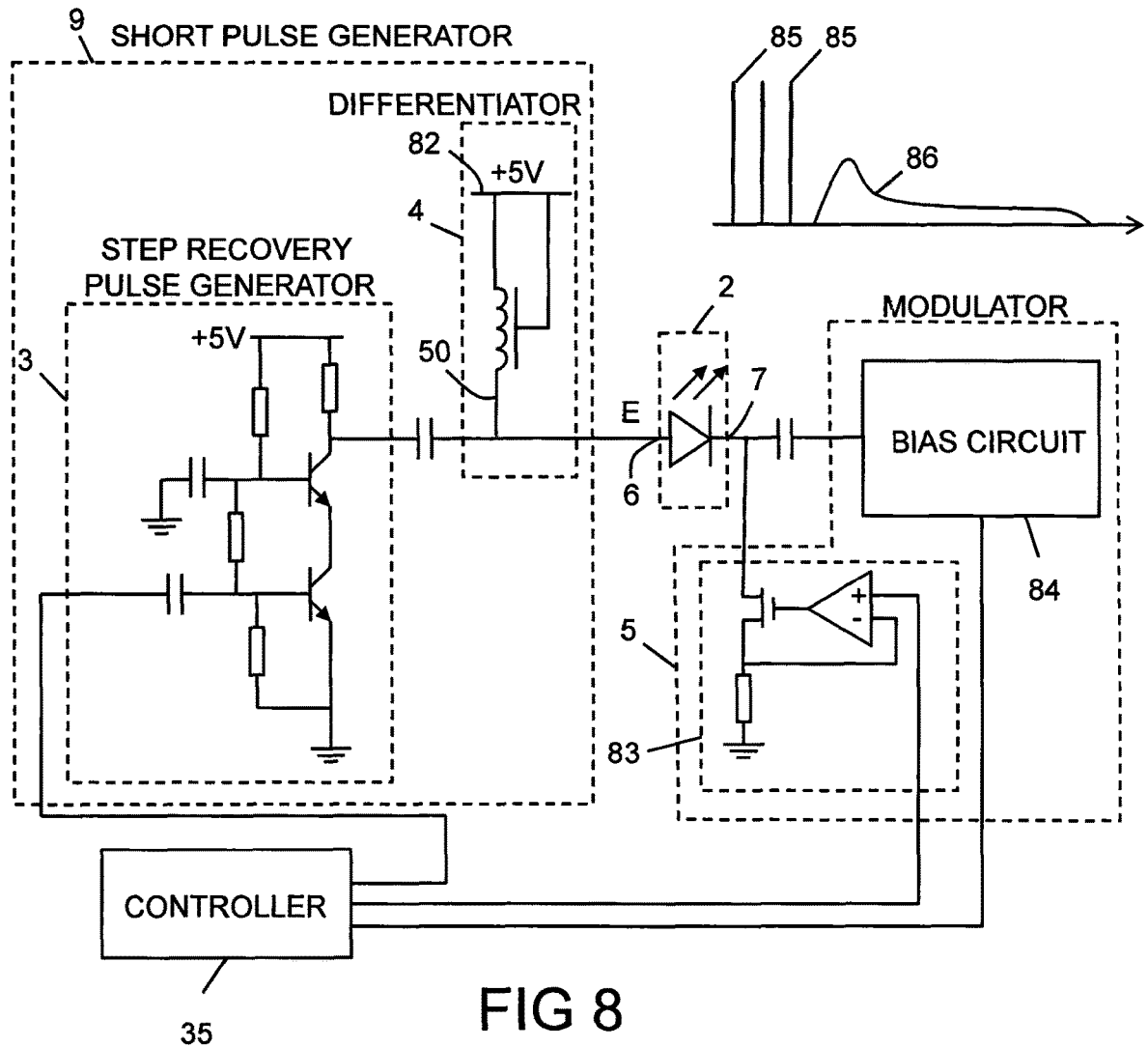
FIG. 8 shows an apparatus that includes a linear drive circuit.

The electrical waveguide 50 in FIGS. 3 and 5 is shown short circuited to the earth plane 56. It is also possible to short circuit the electrical waveguide 50 to a voltage rail 82 as shown with reference to FIG. 8. The voltage rail 82 may be a common voltage rail for the circuit boards, or may be generated specifically for the differentiator 4. Preferably the voltage rail 82 is decoupled to a ground plane or to a reliable earth. The modulator 5 in FIG. 8 is shown as comprising a linear drive 83. When the modulator 5 is turned on, electric current can flow from the voltage rail 82 through the laser diode 2 through the modulator 5 to ground. This current path contains no capacitor coupling elements that would block direct current flow. Subsequent optical amplification, as shown with reference to FIG. 1, can then be used to provide a nanosecond pulsed laser, such as described in U.S. Pat. No. 7,936,796, which patent is hereby incorporated by reference herein. As described in this patent, the optical reflector 16 serves an important function in nanosecond pulsed lasers of preventing stimulated Brillouin scattering from building up and damaging the apparatus. It is also possible to drive the laser diode 2 in normal conduction mode, including driving the laser diode 2 such that it emits continuous wave laser radiation.

Returning to FIG. 8, the modulator 5 can be used to bias the laser diode 2 below threshold in order to generate the optical pulses 10 via the step recovery pulse generator 3. The bias signal 402 can be generated using the linear drive 83. Alternatively or additionally, the bias signal 402 can be generated with a separate bias circuit 84. The bias circuit 84 may comprise a transistor transistor logic (TTL) logic gate. The apparatus of FIG. 8 can be used to provide a picosecond pulse 85 by biasing the laser diode 2 with either the bias circuit 84 or the linear drive 83, and energizing the step recovery pulse generator 3. The apparatus can also be used to generate longer pulses 86, which can have pulse shapes that are tuned by controlling the drive current through the laser diode 2 with the linear drive 83. The apparatus has great utility in that it can provide one or more picosecond pulses 85 followed by, interspersed with, or provided simultaneously with, nanosecond, microsecond, or millisecond pulses 86. Alternatively or additionally, the step recovery pulse generator 3 can be operated while the laser diode 2 is emitting one of the longer pulses 86. As commonly used in the laser industry, picosecond pulses refers to pulses having pulse widths in the range 1 µs and less than 1 ns, nanosecond pulses to pulses in the range 1 ns to less than 1 µs, microsecond pulses to pulses in the range 1 µs to less than 1 ms, and millisecond pulses to pulses in the range 1 ms to less than 1 s.

Figure 9:
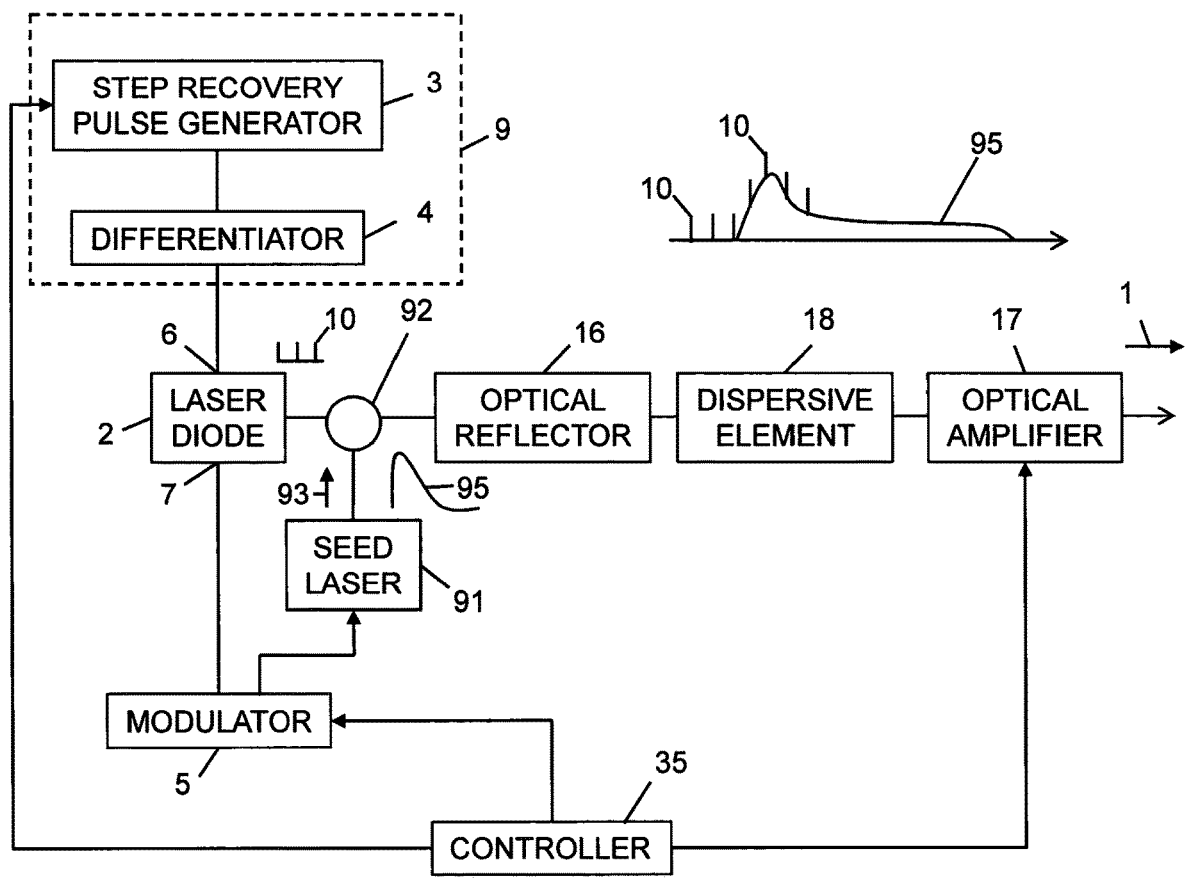
FIG. 9 shows an apparatus that includes a seed laser for generating nanosecond to millisecond optical pulses.

The apparatus of FIG. 1 can also include a seed laser 91 and a coupler 92 as shown with reference to FIG. 9. The coupler 92 is arranged to couple optical radiation 93 emitted by the seed laser 91 with the optical pulses 10 emitted by the laser diode 2 for subsequent amplification by the at least one optical amplifier 17. The coupler 92 may be a coupler, an optical fibre coupler, a polarisation beam splitter, an optical fibre polarisation beam splitter, a wavelength division multiplexing coupler, or any other coupler commonly found in laser products. The seed laser 91 can be operated to provide the optical radiation 93 in the form nanosecond to millisecond long optical pulses 95. The optical pulses 95 can be combined with picosecond to low nanosecond optical pulses 10 from the laser diode 2. The optical pulses 10 can be superimposed on the optical pulses 95 as they propagate towards the optical amplifier 17, as shown in the inset of FIG. 9. Alternatively or additionally the optical pulses 10 can occur at different times from the optical pulses 95. Such flexibility in optical outputs has great utility for cutting, welding, and marking applications, particularly for highly reflective metals where the amplified picosecond pulses from the laser diode 2 can be used, to obtain good coupling of the amplified optical radiation 93 from the seed laser 91.

Figure 10:
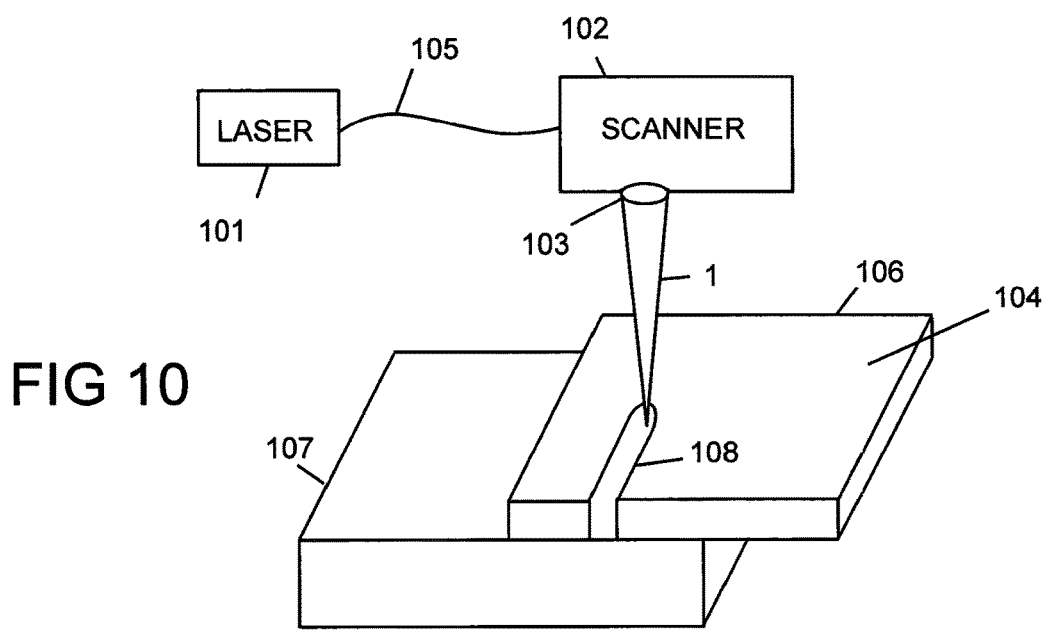
FIG. 10 shows an apparatus including a scanner.

The apparatus described with reference to FIGS. 1 to 9 can also include a scanner 102 for scanning the optical radiation 1 onto a surface 104 of a part 106 as shown with reference to FIG. 10. The laser 101 can comprise the apparatus shown in FIG. 1, 3, 5, 8 or 9. The optical radiation 1 is output from the laser 101, coupled through to the scanner 102 via an optical fibre cable 105, and focused onto the surface 104 using an objective lens 103. The laser 101 is being used to cut a slot 108 in the part 106, and to weld the part 106 to a second part 107. The ability to obtain controllable picosecond, nanosecond, microsecond, and millisecond pulses, as well as continuous wave optical radiation, allows a wide range of materials processing to be achieved.

It is to be appreciated that the embodiments of the invention described above with reference to the accompanying drawings have been given by way of example only and that modifications and additional steps and components may be provided to enhance performance. Individual components shown in the drawings are not limited to use in their drawings and may be used in other drawings and in all aspects of the invention. The present invention extends to the above mentioned features taken singly or in any combination.

The invention claimed is:

1. Apparatus for providing optical radiation, which apparatus comprises a laser diode, a pulse generator, and a modulator, wherein:
   the pulse generator is configured to emit picosecond pulses;
   the modulator is configured to emit nanosecond pulses;
   the laser diode has a first terminal and a second terminal;
   the pulse generator is connected to the first terminal; and
   the modulator is configured to bias the laser diode below a lasing threshold of the laser diode,
   and the apparatus being characterized in that:
   the modulator is connected to the second terminal;
   the pulse generator comprises a semiconductor junction connected to a differentiator;
   the semiconductor junction is such that electric current flowing through the semiconductor junction can be turned off more quickly than it can be turned on; and
   the differentiator is such that a step change that occurs when the electric current flowing through the semiconductor junction is turned off is converted to an electrical pulse, thereby gain switching the laser diode such that it emits an optical pulse having an optical pulse width less than 1 ns.

2. Apparatus according to claim 1 wherein the semiconductor junction forms part of a step recovery device that uses step recovery to turn off the electric current.

3. Apparatus according to claim 1 wherein the semiconductor junction and the differentiator are configured such that the optical pulse width is less than 250 ps.

4. Apparatus according to claim 1 wherein the pulse generator comprises a bipolar transistor having the semiconductor junction.

5. Apparatus according to claim 4 wherein the bipolar transistor is configured as a common base amplifier.

6. Apparatus according to claim 4 wherein the bipolar transistor forms part of a cascode amplifier.

7. Apparatus according to claim 1 wherein the differentiator comprises an electrical waveguide defined by a first length and a first characteristic impedance, the semiconductor junction is connected to a first end of the electrical waveguide, and a second end of the electrical waveguide is defined by an impedance that is less than the first characteristic impedance, thereby causing a step voltage signal defined by a polarity propagating along from the first end of the electrical waveguide to the second end of the electrical waveguide to be reflected back to the first end of the electrical waveguide with the opposite polarity.

8. Apparatus according to 7 wherein the second terminal is connected to the modulator with an electrical waveguide defined by a second length and a second characteristic Impedance, the modulator is defined by an output impedance, and the output Impedance is higher than the second characteristic impedance, thereby causing electrical pulse signals defined by a polarity propagating down the electrical waveguide from the second terminal to the modulator to be reflected with the same polarity.

9. Apparatus according to 7, and comprising at least one optical reflector configured to receive optical pulses emitted by the laser diode, which optical reflector is positioned at a third distance from the laser diode.

10. Apparatus according to claim 1 wherein the laser diode is such that the optical pulse is chirped, and wherein the apparatus includes a dispersive element configured to change the pulse width of the optical pulse.

11. Apparatus according to claim 1 and Including at least one optical amplifier configured to amplify optical pulses emitted by the laser diode.

12. Apparatus according to claim 11 and comprising a seed laser and a coupler, wherein the coupler is arranged to couple optical radiation emitted by the seed laser with the optical radiation emitted by the laser diode for subsequent amplification by the optical amplifier.

13. Apparatus according to claim 12 wherein the apparatus is configured such that optical pulses emitted by the laser diode are superimposed on optical pulses emitted by the seed laser.

14. Apparatus according to claim 1 and including a scanner head for scanning the optical radiation onto a surface of a component.

15. A method for providing optical radiation, comprising providing a laser diode that has a first terminal and a second terminal;
   selecting a modulator that emits nanosecond pulses and which can be configured to bias the laser diode below a lasing threshold of the laser diode;
   and the method being characterized by the following steps:
   selecting a pulse generator that comprises a semiconductor junction connected to a differentiator; wherein the semiconductor junction is such that electric current flowing through the semiconductor junction can be turned off more quickly than it can be turned on;
   the pulse generator is connected to the first terminal;
   the modulator is connected to the second terminal;
   using the modulator to bias the laser diode below a lasing threshold of the laser diode;

causing the semiconductor junction to emit a step change in output voltage as the electric current is turned off;

using the differentiator to differentiate the step change in output voltage to create an electrical pulse; and using the electrical pulse to gain switch the laser diode such that it emits an optical pulse having an optical pulse width less than 1 ns.

16. A method according to claim 15 wherein the semiconductor junction forms part of a step recovery device that uses step recovery to turn off the electric current.

17. A method according to claim 15 wherein the differentiator comprises an electrical waveguide defined by a first length and a first characteristic impedance, the semiconductor junction is connected to a first end of the electrical waveguide, a second end of the electrical waveguide is defined by an impedance that is less than the first characteristic impedance, thereby causing a step voltage signal defined by a polarity propagating along from the first end of the electrical waveguide to the second end of the electrical waveguide to be reflected back to the first end of the electrical waveguide with the opposite polarity.

18. A method according to claim 15, and comprising configuring at least one optical reflector to receive optical pulses emitted by the laser diode, which optical reflector is positioned at a third distance from the laser diode which is selected such that optical pulses reflected by the optical reflector overlap temporally with successive ones of the optical pulses.

19. A method according to claim 15 wherein the optical pulse emitted by the semiconductor laser is chirped, and the method comprises providing a dispersive element to change the pulse width of the optical pulse.

20. A method according to claim 15 and Including at least one optical amplifier configured to amplify optical pulses emitted by the laser diode.

\* \* \* \* \*